United States Patent [19]

Kelly

[11] 3,958,236

[45] May 18, 1976

[54] OFFSET CONTROL IN AUTOZEROING CIRCUITS FOR ANALOG-TO-DIGITAL CONVERTERS

[75] Inventor: Austin T. Kelly, Morristown, N.J.

[73] Assignee: Weston Instruments, Inc., Newark, N.J.

[22] Filed: Dec. 18, 1974

[21] Appl. No.: 534,149

[52] U.S. Cl. .................. 340/347 NT; 340/347 AD; 340/347 CC
[51] Int. Cl.² ..................................... H03K 13/20
[58] Field of Search ............. 340/347 MT, 347 AD, 340/347 CC; 235/183

[56] References Cited
UNITED STATES PATENTS

| | | | |
|---|---|---|---|
| 3,541,446 | 11/1970 | Prozeller | 340/347 NT |
| 3,566,265 | 2/1971 | Reid | 340/347 NT |
| 3,566,397 | 2/1971 | Walton | 340/347 NT |
| 3,747,089 | 7/1973 | Sharples | 340/347 NT |

*Primary Examiner*—Charles D. Miller
*Attorney, Agent, or Firm*—William R. Sherman; I. S. Kavrukov; K. McMahon

[57] ABSTRACT

A dual slope analog-to-digital converter, which has an autozeroing circuit for cancelling out integrator and detector offset and drift, is additionally provided with a circuit for injecting a voltage of selected polarity and magnitude to offset the input voltage of the converter such that the input voltage can be measured with respect to a nonzero reference line.

20 Claims, 3 Drawing Figures

U.S. Patent May 18, 1976 Sheet 1 of 2 3,958,236
Fig. 1.
(PRIOR ART)
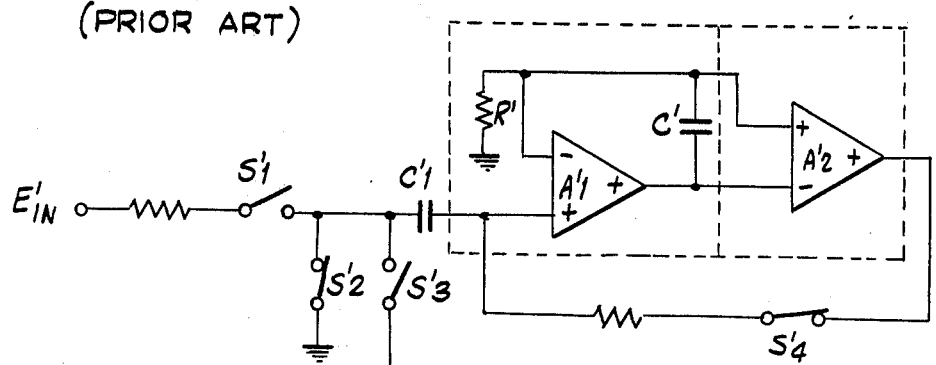
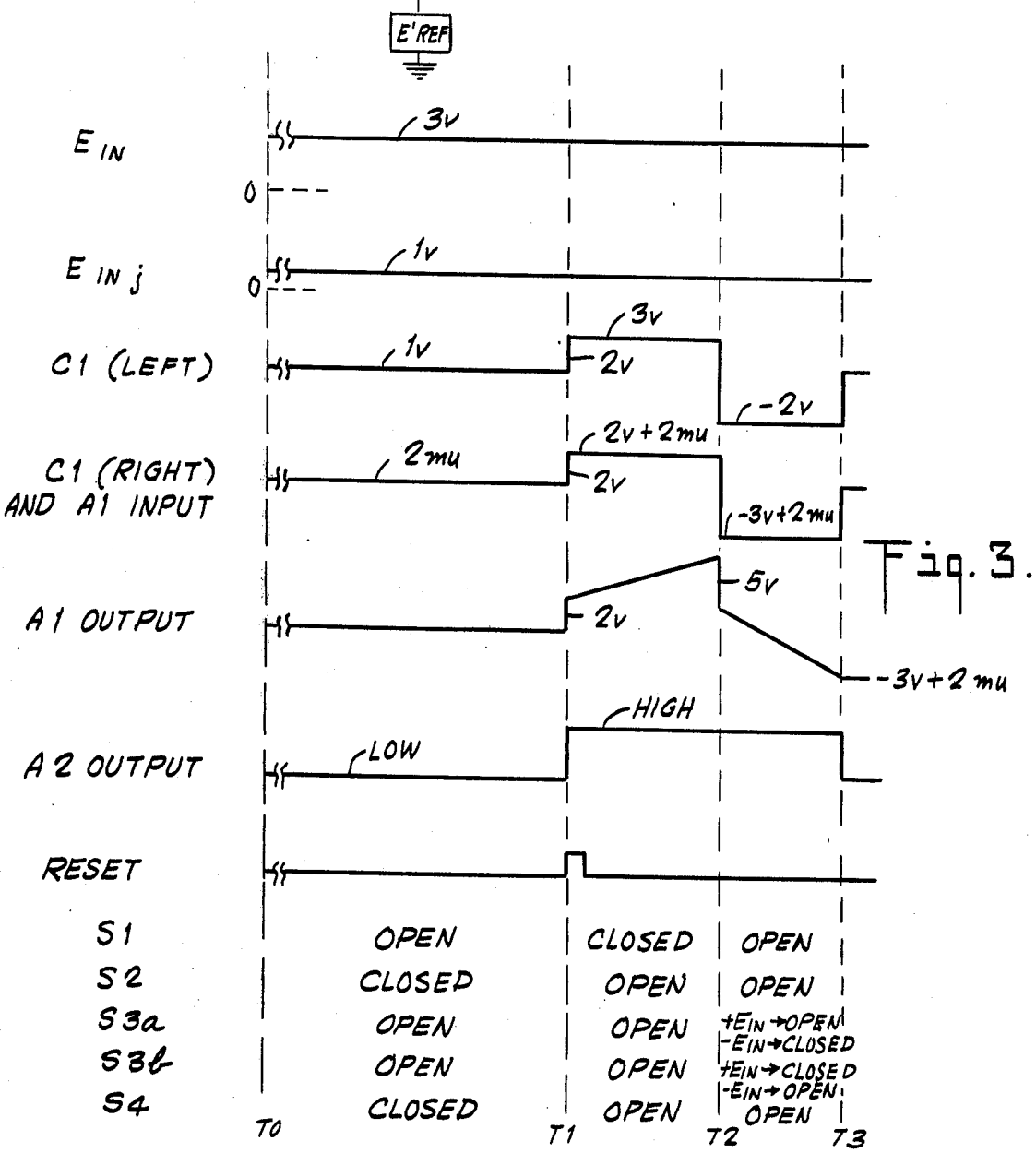
Fig. 3.

OFFSET CONTROL IN AUTOZEROING CIRCUITS FOR ANALOG-TO-DIGITAL CONVERTERS

BACKGROUND OF THE INVENTION

The invention is in the field of analog-to-digital converters and relates specifically to converters of this type which have autozeroing circuits.

The autozeroing circuits in prior art analog-to-digital converters of the dual slope integrating type typically comprise a feedback connection operative prior to each dual slope measurement cycle to charge an input capacitor to an initial charge which reflects the amplifier and detector drift and offset, so that this drift and offset can e cancelled out during the immediately following dual slope measurement cycle. An example of such converter is the Model 1230 Digital Panel Meter manufactured by Weston Instruments, Inc., and additional examples are illustrated in Walton U.S. Pat. No. 3,566,397 and Howlett U.S. Pat. No. 3,581,305. The basic operating principles of dual slope integrating analog-to-digital converters are discussed in Hoeschele, D.F., Analog-to-Digital/Digital-to-Analog Conversion Techniques, Wiley, 1968, pp. 381–384.

Prior art converters of this type typically measure the voltage level of an input signal wih respect to the zero voltage line. It is difficult to provide for offsetting the input voltage in the analog portion of the converter, because the desired offsetting may be cancelled out by the autozeroing circuit in the same manner as the offset and drift of the integrator and the amplifier. Thus, it is difficult with prior art converters of this type to offset the input signal by a desired amount in the analog portion of the converter so as to provide a digital output which represents the level of the input voltage with respect to a nonzero reference line.

SUMMARY OF THE INVENTION

An object of the invention is to provide an analog-to-digital converter in which an injected voltage of selected polarity and magnitude can be combined with the input voltage so that the input voltage can be measured with respect to a nonzero reference line.

A specific embodiment of the invention incorporates certain portions of a conventional analog-to-digital converter of the dual slope integrating type and additionally incorporates an injected voltage source and appropriate switches and control circuits for operating the converter in accordance with the invention. During an initial time interval, prior to a dual slope measurement cycle, the input capacitor which is normally used for autozeroing is charged to a potential representing the difference between an injected voltage and the amplifier and drift of the integrator and detector. During the fixed time interval of the dual slope measurement cycle, the integrator integrates a measurement signal which is the algebraic difference between the input voltage to the converter and the initial charge on the input capacitor. During the variable time interval of the dual slope measurement cycle, the integrator integrates a reference signal which is the algebraic sum of the initial charge on the input capacitor and the series combination of the injected voltage and a reference voltage, this integration being in a direction opposite that of the first integration and continuing until the integrator output crosses the reference voltage. The result of this sequence is that while the offset and drift of the amplifier and the detector cancel out, the input voltage to the converter is offset by the injected voltage, and the duration of the variable time interval is proportional to the algebraic difference of the input voltage and the injected voltage. As a result, the digital output of the converter is a number representing the level of the input voltage with respect to a reference line which is above or below the zero voltage line by an amount that can be selected by selecting the polarity and magnitude of the injected voltage.

BRIEF DESCRIPTION OF THE DRAWING

FIG. 1 illustrates the portion of a prior art dual slope analog-to-digital converter which is relevant to this invention.

FIG. 3 is a timing diagram illustrating certain signal changes occurring in the converter of FIG. 2.

DETAILED DESCRIPTION

Figure 2:
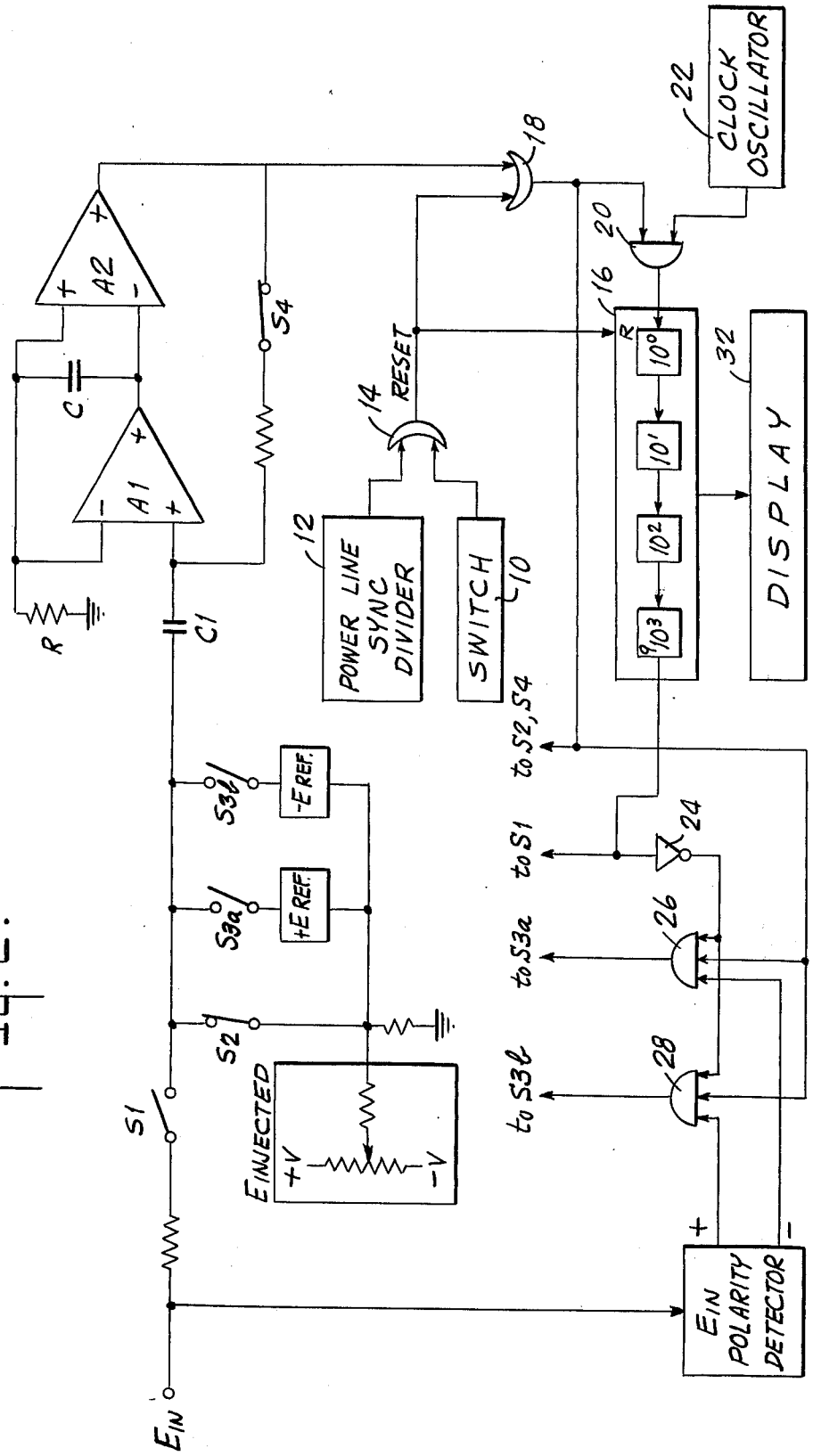
FIG. 2 illustrates an analog-to-digital converter incorporating the invention.

In the prior art analog-to-digital converter of the dual slope integrating type which is illustrated in FIG. 1, switches $S'2$ and $S'4$ are closed during an initial time interval prior to a dual slope measurement cycle to thereby place on the input capacitor C1 a charge representing the offset and drift of the integrating amplifier $A'1$ and the detector amplifier $A'2$. At the start of the immediately following fixed time interval, switches $S'2$ and $S'4$ open and switch $S'1$ closes, to thereby apply to the integrating amplifier $A'1$ a measurement signal reflecting the combination of the input signal $E'_{in}$, and the initial charge on the input capacitor $C'1$. At the start of the immediately following variable time interval, switch $S'1$ opens and switch $S'3$ closes, to thereby apply to the integrating amplifier $A'1$ a reference signal which is the combination of the reference voltage from a source $E'_{ref}$ and the initial charge on the input capacitor $C'1$. Since the input voltage and the reference voltage are of opposite polarity, and since the charge on the input capacitor $C'1$ remains throughout the dual slope measurement cycle, the effect of the offset and drift of the amplifier is cancelled out, provided it remains reasonably constant during the measurement cycle although it may change as between successive measurement cycles. The input voltage in converters of this type can not be simply offset by combining it with an analog offset signal because the desired offset signal would be indistinguishable from the amplifier drift and offset and may be cancelled out along with the amplifier drift and ofset.

In the embodiment of FIG. 2, which incorporates the invention, means are provided for off-setting the input voltage in such a way that the converter can distinguish between the desired offset and the amplifier drift and offset, and can measure the offset input voltage while still cancelling out the amplifier drift and offset.

The converter shown in FIG. 2 includes an integrator, a detector and an input capacitor which are in the configuration used in prior art dual slope converters with autozeroing. Specifically, the integrator comprises an integrator amplifier A1, an integrating capacitor C connected between the inverting input of amplifier A1 and the amplifier output and an integrating resistor R connecting the inverting input of that amplifier A1 to ground. The detector comprises a detector amplifier A2 whose inverting and noninverting inputs are connected across the integrating capacitor C so that the output of the detecting amplifier A2 is low when there is no charge on the integrating capacitor C and is high when there is a charge on the integrating capacitor C. The right side of the input capacitor C1 is connected to the noninverting input of the integrator amplifier A1 and A1 and is connected to the output of the detector amplifier A2 through a switch S4.

However, the left side of the input capacitor is not connected to the input voltage and to a reference voltage, as in the prior art, but is connected in accordance with this invention, so as to provide the desired end result. Specifically, the left side of the input capacitor C1 is connected: (1) to the source of the input voltage $E_{in}$ (which is to be measured) through a switch S1, (2) to a source of an injected voltage $E_{inj}$ through a switch S2, and (3) to a source of positive reference voltage plus $E'_{ref}$ through a switch S3b and to a source of a negative reference voltage $-E'_{ref}$ through a switch S3b. The reference voltage sources are not grounded, but are connected to the junction between the switch S2 and the injected voltage source.

During an initial time interval, prior to a dual slope measurement cycle, switches S2 and S4 are closed so that the input capacitor C1 stores a charge reflecting the combination of the injected voltage and the offset and drift of the integrator and detector amplifiers A1 and A2, i.e., the left side of the input capacitor is at the potential of the injected voltage $E_{inj}$ while its right side is at a potential equal to the level of the offset and drift of the amplifiers A1 and A2.

At the start of the fixed time interval of the dual slope measurement cycle, switches S2 and S4 open and switch S1 closes, to thereby apply to the integrator amplifier A1 a measurement voltage which is the algebraic sum between the input voltage $E_{in}$ and the initial charge on the input capacitor C1. Switch S1 remains closed throughout the fixed time interval, and switches S2 and S4 remain open throughout both the fixed time interval and the variable time interval of the dual slope measurement cycle.

At the end of the fixed time interval, switch S1 opens and the switch for the reference voltage source whose polarity is opposite that of the input voltage closes. This state of the switches remains throughout the variable time interval. If the measurement voltage integrated during the fixed time interval is positive, switch S3b is closed at the end of the fixed time interval; if the measurement voltage is negative, switch S3a is closed at the end of the fixed time interval. The reference voltage which is applied to the integrator amplifier A1 during the variable time interval is the algebraic sum of: (1) the injected voltage $E_{inj}$, (2) the reference voltage $+E'_{ref}$ or $-E'_{ref}$, depending on the polarity of the measurement voltage, and (3) the initial charge on the input capacitor C1. The variable time interval ends when the output of the integrator amplifier A1 equals the reference voltage $+E'_{ref}$ or $-E'_{ref}$. The duration of the dual slope measurement cycle with respect to the initial time period and the characteristics of the input capacitor C1 are such that the initial charge on the input capacitor C1 does not appreciable change during the dual slope measurement cycle.

The voltage levels at certain points of the converter shown in FIG. 2 are illustrated in FIG. 3 for a positive input voltage $E_{in}$ and a positive injected voltage $E_{inj}$ whose level is lower than that of $E_{in}$.

During the initial time interval from $T_0$ to $T_1$, only switches S2 and S4 are closed, all other switches being open. Suppose the input voltage is 3 volts, the injected voltage is 1 volt, the reference voltage $-E_{ref}$ is $-3$ volts, and the offset and drift of the amplifiers is 2 millivolts. During this initial time interval the initial charge on the input capacitor is the difference between 1 v. and 2 mv., the integrator is not integrating and the output of the detector amplifier A2 is at a logical low level.

At the start of the fixed time interval at $T_1$, switches S2 and S4 open while switch S1 closes, and this state remains throughout the fixed time interval. At time $T_1$ therefore, the potential at the left side of the input capacitor C1 is raised by the difference between the input and injected voltages, i.e., by 2 volts, and the potential of the right side of the input capacitor goes up by the same 2 volts, but from the 2 millivolt levels that it had during the initial time interval. The charge on the input capacitor remains the same because its characteristics and the duration of the measurement cycle are appropriately selected to insure that. The voltage level at the input of the integrator amplifier A1 therefore goes up by 2 volts, and this is the measurement signal which is being integrated during the fixed time interval. The output of the amplifier A1 goes up by these two volts at time $T_1$ and ramps up from that value. Note that the output of the detector amplifier goes to a logical high at time $T_1$.

At the end of the fixed time interval at time $T_2$, switch S1 opens and switch S3b closes, this state remaining through the end of the variable time interval at time $T_3$. At the start of the variable time interval at time $T_2$, the potential at the left side of the input capacitor C1 drops to a negative voltage which is the algebraic sum of the injected voltage and the voltage of the negative reference source $-E_{ref}$, i.e., from three volts to $-2$ volts. The reference voltage which is at this time applied to the input of the integrator amplifier A1 is the combination of this $-2$ volt and the initial charge on the capacitor C1, i.e., $-3$ volts reduced by the 2 mv. amplifier drift and offset. The integrator now ramps down until the charge on the integrating capacitor C drops to 0 (both sides thereof are at $-3$ volts) at which time the output of the detector amplifier A2 goes from a logical high to a logical low, to thereby end the variable time interval. Note that the duration of this variable time interval is a measure of the level of the input voltage $E_{in}$ with respect to the level of the injected voltage $E_{inj}$, rather than with respect to zero.

The circuitry necessary to open and close the switches at the appropriate times and to measure the fixed and variable time intervals operates as follows. Switches S2 and S4 are normally closed so that the input capacitor C1 can store the initial charge discussed above prior to a dual slope measurement cycle. A dual slope measurement cycle is started at time $T_1$ by a reset pulse provided either by momentarily closing a manual switch 10 or by suitably time dividing the powerline frequency by a divider 12. An OR-gate 14 passes the reset pulse directly to the reset input of a four-stage decimal counter 16 for resetting the counter 16 to a count of 9000 at this time $T_1$, and is passed by an OR-gate 18 to enable an AND-gate 20 to thereby start applying the clock pulses from an oscillator 22 to the counter 16. The counter 16 therefore starts counting up from its initial count of 9000 at time T1. As the counter 16 is reset to 9000 at time T1, the decimal 9 output of its highest order stage goes to logical high and this logical high signal is applied to the normally open switch S1 to close it and keep it closed for as long as the applied signal remains high. The reset signal from OR-gate 18 is applied to the normally closed switches S2 and S4 to open them, and these switches remain open even after the reset pulse goes down from its logical high state because the OR-gate 18 receives the logical high output of the detector amplifier A2.

The fixed time interval ends at the first clock pulse after the counter 16 has accumulated a count of 9999. This first clock pulse changes the 9 output of the highest order counter stage from logical high to logical low, thereby opening switch S1. The inverse of the signal from the 9 output of the highest order counter stage is provided by an inverter 24 and is applied to each of AND-gates 26 and 28. Each of these gates 26 and 28 has an input from the output of the OR-gate 18, and this input being high at this time. Additionally, each of gates 26 and 28 has an input from a polarity detector 30 which is connected to the input voltage source, detects its polarity, and provides a logical high signal only on its output marked plus when the input voltage is positive and only on its output marked minus when the input voltage is negative. The plus output of the polarity detector 30 is an input to AND-gate 28, while the negative output is an input to the AND-gate 26. Thus, if the input voltage is positive, AND-gate 28 is enabled at time T2 and its logical high output closes the normally open switch S3b to thereby connect the left side of the input capacitor C1 to the series combination of the injected voltage source and the negative voltage reference source. If the input voltage is negative, AND-gate 26 is enabled at time T2, and the logical high at its output closes the normally open switch S3a to thereby apply to the input capacitor C1 the series combination of the injected voltage source and the positive reference voltage source. Meanwhile, the AND-gate 20 is still enabled and the counter 16 is counting up from the zero count present in it at time T2. When the integrating capacitor C becomes discharged at time T3, the output of the detector amplifier A2 changes from logical high to logical low, thereby disabling AND-gate 20 and stopping the counter 16. The count at which the counter 16 stops is a measure of the level of the input voltage as offset by the injected voltage. This count can be displayed at a conventional display 32. The display 32 may be connected to the output of the detector amplifier A2 or to the output of the OR-gate 18 by a suitable detector circuit (not shown) so as to display a count only between dual slope measurement cycles when the counter contents are not changing, thereby avoiding flicker.

It should be clear that the illustrated switches should be fast acting switches, such as conventional fast acting transistor switches, so that the appropriate opening and closing of the appropriate switches at times T1, T2, and T3 can take place substantially instantaneously, with the dual slope measurement cycle being of the order of milliseconds, and with the interval between successive dual slope cycles being of the order of at least 100 milliseconds. The divider 12 can be set to put out reset pulses at any suitable interval, e.g. every half second, so that repetitive measurements of an input voltage can be carried out. Alternately, an external triggering source (not shown) can be used instead of the switch 10 and divider 12 to start measurement cycles at the occurrence of some external event by applying suitable reset pulses to gate 14. It should be clear that the polarity and magnitude of the injected voltage $E_{inj}$, the polarity and magnitude of the reference voltages and the polarity and magnitude of the input voltage can be different from those discussed above.

I claim:
1. A measuring device comprising:
an integrator amplifier and a detector amplifier each having a noninverting input and an inverting input and an output, an integrating capacitor connected between the inverting input and the output of the integrator amplifier, an integrating resistor connecting the inverting input of the integrator amplifier to ground, means for connecting the output of the integrator amplifier to the inverting input of the detector amplifier, means for connecting the inverting input of the integrator amplifier to the noninverting input of the detector amplifier, said detector amplifier providing at its output, when its inputs are at the same level, an offset voltage signal determined by the drift and offset of the amplifiers, and an input capacitor having a right side connected to the noninverting input of the integrator amplifier and a left side;

a source of an input voltage signal, a source of an injected voltage signal, and a source of a reference voltage signal;

a first switch connecting the source of the input voltage signal to the input capacitor and applying, only when closed, the input voltage signal to the left side of the input capacitor;

a second switch connecting the source of the injected voltage signal to the input capacitor and applying, only when closed, the injected voltage signal to the left side of the input capacitor;

a third switch connecting the sources of the injected and the reference voltage signals to the input capacitor and applying, only when closed, the combination of the injected and the reference voltage signals to the left side of the input capacitor;

a fourth switch connecting the detector amplifier output and the input capacitor and applying, only when closed, the offset voltage signal from the output of the detector amplifier to the right side of the input capacitor;

means for maintaining the second and fourth switches closed and the first and third switches open for an initial time interval whose duration is sufficient to store in the input capacitor an initial charge determined by the relative levels of the injected voltage signal and the offset voltage signal;

means for maintaining the first switch closed and the second, third and fourth switches open for a subsequent time interval of a fixed duration, which is substantially shorter than the duration of the initial time interval, to apply to the noninverting input of the integrator amplifier during said fixed time interval a measurement signal determined by the combination of the input voltage signal and the initial charge of the input capacitor; and means for maintaining the third switch closed and the first, second and fourth switches open for a subsequent, variable time interval which ends when the inputs of the detector amplifier reach the same level, to apply to the noninverting input of the integrator amplifier during this variable time interval a voltage signal determined by the combination of the injected voltage signal, the reference voltage signal and the initial charge of the input capacitor.

2. A measuring device as in claim 1 wherein the source of the reference voltage signal comprises a source of a positive reference voltage and a source of a negative reference voltage, the third switch comprises a positive third switch for applying, only when closed, the positive reference voltage to the input capacitor and a negative third switch for applying, only when closed, the negative reference voltage to the input capacitor, and the means for maintaining the third switch closed comprises means for detecting the polarity of the input voltage signal and for maintaining closed a selected one only of said positive and negative third switches depending on the polarity of the input voltage signal.

3. A measuring device as in claim 2 wherein the voltage signals applied to the integrator during the fixed and the variable time intervals are of opposite polarity.

4. A measuring device comprising:
an integrator having an input and an integrating capacitor;
an input capacitor having a right side connected to the integrator input and a left side;
a source of an input voltage signal, a source of an injected voltage signal, and a source of a reference voltage signal;
a first switch connecting the source of the input voltage signal and the input capacitor and applying, only when closed, the input voltage signal to the left side of the input capacitor;
a second switch connecting the source of the injected voltage signal and the input capacitor and applying, only when closed, the injected voltage signal to the left side of the input capacitor;
a third switch connecting the sources of the injected and the reference voltage signals to the input capacitor and applying, only when closed, the combination of the injected and the reference voltage signals to the left side of the input capacitor;
means for maintaining the second switch closed and the first and third switches open for an initial time interval whose duration is sufficient to store in the input capacitor an initial charge determined by the injected voltage signal;
means for maintaining the first switch closed and the second and third switches open for a subsequent time interval of a fixed duration, which is substantially shorter than the initial time interval, to apply to the integrator a measurement signal determined by the combination of the input voltage signal and the initial charge of the input capacitor; and
means for maintaining the third switch closed and the first and second switches open for a subsequent, variable time interval which ends when the charge on the integrating capacitor reaches a selected level.

5. A measuring device as in claim 4 including
means for providing an offset voltage signal determined by the offset and drift of the amplifier;
a fourth switch for applying, only when closed, the offset voltage signal to the right side of the input capacitor; and
means for maintaining the fourth switch closed only for the duration of the initial time interval, to cause said initial charge on the input capacitor to be determined by the combination of the injected voltage signal and the offset voltage signal.

6. A measuring device as in claim 4 wherein the source of the reference voltage signal comprises a source of a positive reference voltage and a source of a negative reference voltage, the third switch comprises a positive third switch for applying, only when closed, the positive reference voltage to the input capacitor and a negative third switch for applying, only when closed, the negative reference voltage to the input capacitor, and the means for maintaining the third switch closed comprises means for detecting the polarity of the input voltage signal and for maintaining in a closed state a selected one only of said positive and negative third switches depending on the detected polarity of the input voltage signal.

7. A measuring device comprising:
an integrator having an input and providing an output which is an integral function of the signal applied to its input;
a source of an input voltage signal, a source of an injected voltage signal of a selected level and a source of a reference voltage signal;
means for storing the injected voltage signal, independently of the reference voltage signal, during an initial time interval;
means for combining the stored injected voltage signal and the input voltage signal and for applying the resulting combined signal to the integrator input during a subsequent time interval whose duration is fixed; and
means for combining the stored injected voltage signal and the reference voltage signal and for applying the resulting combined signal to the same said integrator input during a subsequent time interval whose duration is variable and which ends when the integrator output crosses a selected threshold level.

8. A measuring device as in claim 7 including means for providing a first offset voltage signal which is a function of the offset and drift of the integrator and for storing during said initial time interval the combination of the injected voltage signal and said first offset voltage signal rather than only the injected voltage signal.

9. A measuring device as in claim 8 including a detector for detecting when the integrator output crosses said selected threshold level and including means for providing a second offset voltage signal which is a function of the offset and drift of the detector and for storing in the storing means during the initial time interval the combination of the injected voltage signal and said first and second offset voltage signals rather than only the combination of the injected voltage signal and the first offset voltage signal.

10. A measuring device comprising:
integrator means having an input and an output and responding to a voltage signal applied to its input to provide at its output a corresponding voltage ramp, and detector means connected to the output of the integrator means for detecting when the ramp provided by the integrator means crosses a defined threshold;
an input capacitor connected to the input of the integrator means;
means for providing an input voltage signal, an injected voltage signal of a selected level, and a reference voltage signal;
means for providing an offset voltage signal which is a function of the offset and drift of the integrator means and of the detector means, and means for storing in the input capacitor an initial charge determined by the relative levels of the injected voltage signal and the offset voltage signal;

means for combining the initial charge on the input capacitor and the input voltage to form a measurement signal and for applying the measurement signal to the input of the integrator means during a fixed time interval to cause the integrator means to provide at its output a corresponding first ramp in a first direction; and means for combining the initial charge on the input capacitor and the reference and injected voltage signals and for applying the resulting combined signal to the same said input of the integrator means during a subsequent, variable time interval to cause the integrator means to provide at its output a corresponding second ramp, said variable time interval ending when the detector means detects the crossing of the defined threshold by the second ramp and the duration of said variable time interval corresponding to the level of the input voltage signal as offset by the injected voltage signal.

11. A measuring device as in claim 10 wherein the polarity of the combined signal applied to the input of the integrator means during the variable time interval is opposite that of the measurement signal applied to the input of the integrator means during the fixed time interval.

12. A measuring device as in claim 11 wherein the defined threshold is the level of the combined signal applied to the input of the integrator means during the variable time interval.

13. A measuring device as in claim 11 wherein the means for providing a reference voltage signal comprises means for providing a positive reference voltage and a negative reference voltage, and the means for applying the combined signal to the input of the integrator means during the variable time interval comprises means for detecting the polarity of the input voltage signal and for forming the last recited combined signal by combining the initial charge and the injected voltage signal with the negative reference voltage when the input voltage is positive and with with positive reference voltage when the input signal is negative.

14. A measuring device as in claim 11 wherein the initial charge is determined by the difference between the injected voltage signal and the offset voltage signal, the measurement signal is determined by the difference between the input voltage signal and the initial charge on the input capacitor, and the combined signal applied during the variable interval is determined by the difference between, on the one hand, the sum of the injected and reference voltage signals and, on the other hand, the initial charge on the input capacitor.

15. A measuring device as in claim 11 including means for measuring the duration of the variable time interval and for displaying the measurement results.

16. A measuring device as in claim 11 including means for causing a succession of measurement cycles, each measurement cycle comprising a fixed and a variable time interval, and means for storing an initial charge between successive measurement cycles.

17. A method of measuring an input voltage signal as offset by a selected injected voltage signal comprising the steps of:

providing an integrator responding to a voltage signal applied to its input to provide at its output a corresponding voltage ramp, a detector connected to the output of the integrator for detecting when the ramp crosses a defined threshold, an input capacitor connected to the input of the integrator, and a source of an input voltage signal, an injected voltage signal, and a reference voltage signal;

storing in the input capacitor an initial charge determined by the difference between the injected voltage signal and an offset signal determined by the offset and drift of the integrator and of the detector;

forming a measurement signal by combining the input voltage signal and the initial charge on the input capacitor and applying the measurement signal to the input of the integrator during a subsequent, fixed time interval to provide at the integrator input a corresponding first ramp; and forming a combined signal by combining the initial charge on the input capacitor and the injected and reference signals and applying the combined signal to the same said integrator input during a subsequent, variable time interval to provide at the integrator output a corresponding second ramp, said variable time interval ending when the detector detects the crossing of the defined threshold by the integrator output, and the duration of the variable time interval being determined by the level of the input voltage signal as offset by the injected voltage signal.

18. A method as in claim 17 including selecting the polarity of the combined signal to be opposite that of the measurement signal.

19. A method as in claim 18 wherein the initial charge on the input capacitor is determined by the difference between the injected voltage signal and the offset signal, the measurement signal is determined by the difference between the injected voltage signal and the initial charge on the input capacitor, and the combined signal is determined by the difference between the sum of the injected and reference voltage signals and the initial charge on the input capacitor.

20. A method as in claim 17 wherein the polarity of the combined signal is selected to be opposite that of the difference between the input and the injected voltage signals.

* * * * *